United States Patent
Nakao (10) Patent No.: US 6,897,552 B2
(45) Date of Patent: May 24, 2005

(54) SEMICONDUCTOR DEVICE WHEREIN CHIPS ARE STACKED TO HAVE A FINE PITCH STRUCTURE

(75) Inventor: Mitsuhiro Nakao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/314,994

(22) Filed: Dec. 10, 2002

(65) Prior Publication Data
US 2003/0111722 A1 Jun. 19, 2003

(30) Foreign Application Priority Data
Dec. 12, 2001 (JP) ........................................ 2001-378779

(51) Int. Cl.⁷ .......................... H01L 23/48; H01L 29/40
(52) U.S. Cl. ........................ 257/686; 257/685; 257/777; 257/778; 257/723; 257/712; 257/704; 257/532; 257/728; 257/725; 257/724; 257/528; 257/720
(58) Field of Search ................................ 257/686, 685, 257/723, 777, 778, 737, 738, 712, 704, 701, 717, 720, 532, 724, 728, 725, 528, 784, 782, 787, 698, 696, 772, 779, 734

(56) References Cited

U.S. PATENT DOCUMENTS

| | | | | |
|---|---|---|---|---|
| 6,013,948 A | * | 1/2000 | Akram et al. ............... | 257/698 |
| 6,020,629 A | * | 2/2000 | Farnworth et al. .......... | 257/686 |
| 6,413,798 B2 | * | 7/2002 | Asada ........................ | 438/108 |
| 6,472,734 B2 | * | 10/2002 | Arakawa et al. ............ | 257/686 |
| 6,472,735 B2 | * | 10/2002 | Isaak .......................... | 257/686 |
| 6,661,098 B2 | * | 12/2003 | Magerlein et al. .......... | 257/777 |
| 6,759,268 B2 | * | 7/2004 | Akagawa .................... | 438/106 |
| 2001/0040290 A1 | * | 11/2001 | Sakurai et al. .............. | 257/737 |
| 2002/0011677 A1 | * | 1/2002 | Yokoi et al. ................ | 257/782 |
| 2002/0056906 A1 | * | 5/2002 | Kajiwara et al. ........... | 257/697 |
| 2002/0195720 A1 | * | 12/2002 | Miyazaki .................... | 257/778 |
| 2003/0001286 A1 | * | 1/2003 | Kajiwara et al. ........... | 257/778 |
| 2003/0116866 A1 | * | 6/2003 | Cher 'Khng et al. ....... | 257/780 |

FOREIGN PATENT DOCUMENTS

| | | |
|---|---|---|
| JP | 09-260421 | 10/1997 |
| JP | 10-056259 | 2/1998 |
| JP | 10-056260 | 2/1998 |
| JP | 10-112476 | 4/1998 |
| JP | 10-135267 | 5/1998 |
| JP | 11-251363 | 9/1999 |
| JP | 11-297753 | 10/1999 |
| JP | 2001-223243 | 8/2001 |
| JP | 2001-257237 | 9/2001 |

* cited by examiner

Primary Examiner—Alexander Oscar Williams
(74) Attorney, Agent, or Firm—Finnegan, Henderson, Farabow, Garrett & Dunner, L.L.P.

(57) ABSTRACT

There is here disclosed a semiconductor device comprising a chip-mounting-member having a lead formed on its major surface, the lead having a thin film plated portion which covers a surface of a predetermined portion of the lead, a semiconductor chip having a bump formed on its major surface, and mounted on the chip-mounting-member by electrically connecting the bump to the lead via the plated portion, and an encapsulating-member formed between the semiconductor chip and the chip-mounting-member.

9 Claims, 3 Drawing Sheets

SEMICONDUCTOR DEVICE WHEREIN CHIPS ARE STACKED TO HAVE A FINE PITCH STRUCTURE

CROSS-REFERENCE TO RELATED APPLICATIONS

This application is based upon and claims the benefit of priority from the prior Japanese Patent Application No. 2001-378779, filed Dec. 12, 2001, the entire contents of which are incorporated herein by reference.

BACKGROUND OF THE INVENTION

1. Field of the Invention

The present invention relates to a technique of connecting and encapsulating a semiconductor chip to a mounting-member by a flip chip method and, more particularly, to a semiconductor device in which the structure and connected state near the electrodes of a semiconductor chip and a mounting-member are improved, and a method of fabricating the same.

2. Description of the Related Art

Steps of electrically connecting a semiconductor chip onto a mounting-member such as a package, and adhering and encapsulating the semiconductor chip and a mounting-member by a general flip chip wireless bonding method will be briefly explained below.

Figure 7:
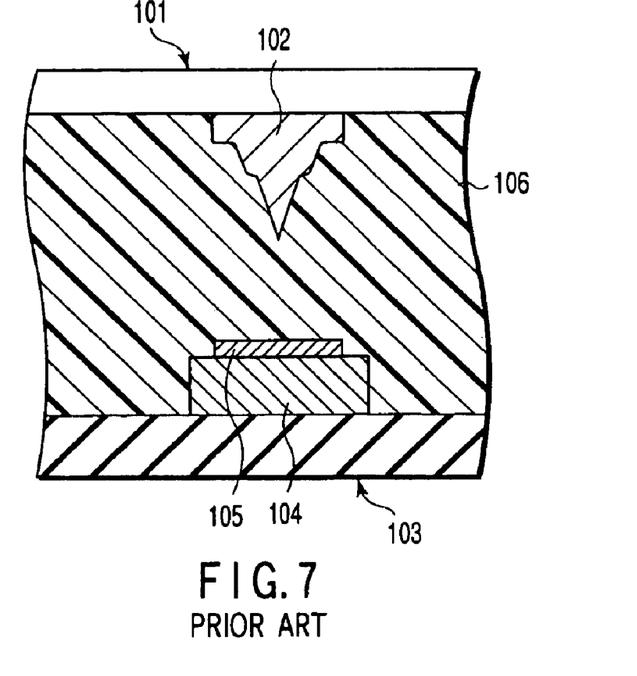
FIG. 7 is a sectional view showing a step of a method of fabricating a semiconductor device according to prior art.

For example, as shown in FIG. 7, a semiconductor chip 101 and a glass-epoxy-substrate 103 as a mounting-member are opposed to each other. In this state, a gold (Au) stud-bump 102 and a copper (Cu) lead 104 formed on the substrate 103 are aligned. On the lead 104, an Sn—Ag plated-bump 105 which is a thick projection (projected-member) having substantially the same size as the width of the lead 104 is stacked beforehand by electroplating. This plated-bump 105 can also be formed using Sn. The width of the plated-bump 105 is more specifically about 50 $\mu$m.

Figure 8:
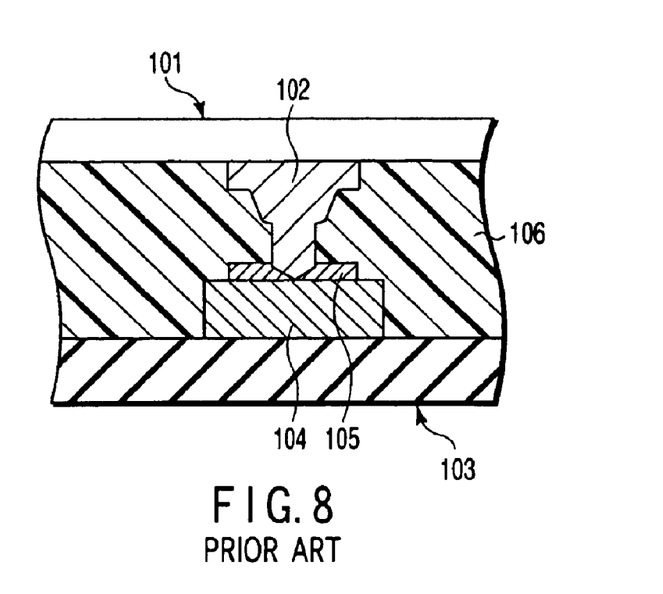
FIG. 8 is a sectional view showing a step of the method of fabricating the semiconductor device according to the prior art.

An encapsulating resin 106 such as a thermosetting insulating film is filled between the chip 101 and the substrate 103. In this state, the chip 101 is adhered to the substrate 103 by thermocompression. Consequently, as shown in FIG. 8, the stud-bump 102 and lead 104 are connected via the plated-bump 105. That is, the electrical connection between the stud-bump 102 and lead 104 and the encapsulation of the semiconductor chip 101 and the glass-epoxy-substrate 103 with the encapsulating resin 106 are simultaneously performed.

Recently, in the field of semiconductor device fabrication technology, small lead pitches are increasingly demanded along with advanced micropatterning and an increase in density of devices. That is, it is more and more demanded to decrease lead pitches. However, the width of a normal plated-bump 105 is as large as about 50 $\mu$m, and this is the largest obstacle to decreasing pitches. Unfortunately, if the width of the lead 104 is simply decreased, the stacking position of the plated-bump 105 easily deviates when this plated-bump 105 is formed on the lead 104, or the plated-bump 105 easily falls from the lead 104. As a consequence, poor electrical connection may occur between the stud-bump 102, lead 104, and plated-bump 105. This may lead to deterioration of the quality such as the electrical performance and reliability of the semiconductor device. Furthermore, the positional deviation of the plated-bump 105 lowers the fabrication yield of the semiconductor device. This may decrease the production efficiency of the semiconductor device.

BRIEF SUMMARY OF THE INVENTION

According to an aspect of the invention, there is provided a semiconductor device comprising a chip-mounting-member having a lead formed on its major surface, the lead having a thin film plated portion which covers a surface of a predetermined portion of the lead, a semiconductor chip having a bump formed on its major surface, and mounted on the chip-mounting-member by electrically connecting the bump to the lead via the plated portion, and an encapsulating-member formed between the semiconductor chip and the chip-mounting-member.

According to an other aspect of the present invention, there is provided a semiconductor device fabrication method comprising opposing a semiconductor chip having a bump formed on its major surface to a chip-mounting-member having a lead formed on its major surface, the lead having a thin film plated portion which covers a surface of a predetermined portion of the lead, forming an encapsulating-member between the semiconductor chip and the chip-mounting-member, and electrically connecting the bump and the lead via the plated portion, and encapsulating and adhering the semiconductor chip and the chip-mounting-member by using the encapsulating-member, thereby connecting/encapsulating the semiconductor chip and the chip-mounting-member.

According to an other aspect of the present invention, there is provided a semiconductor device fabrication method comprising opposing a semiconductor chip having a bump formed on its major surface to a chip-mounting-member having a lead and an encapsulating-member formed on its major surface, the lead having a thin film plated portion which covers a surface of a predetermined portion of the lead, and electrically connecting the bump and the lead via the plated portion, and encapsulating and adhering the semiconductor chip and the chip-mounting-member by using the encapsulating-member, thereby connecting/encapsulating the semiconductor chip and the chip-mounting-member.

DETAILED DESCRIPTION OF THE INVENTION

The present invention will be described in detail below by way of its embodiments shown in the drawing.

(First Embodiment)

Figure 1:
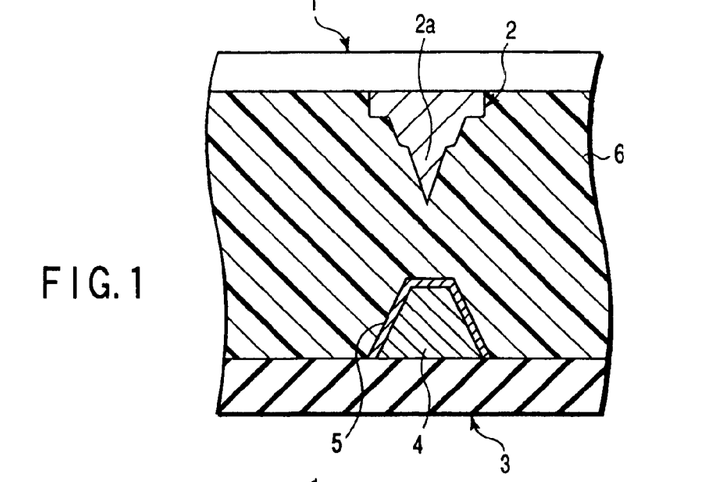
FIG. 1 is a sectional view showing a step of a method of fabricating a semiconductor device according to the first embodiment.
Figure 2:
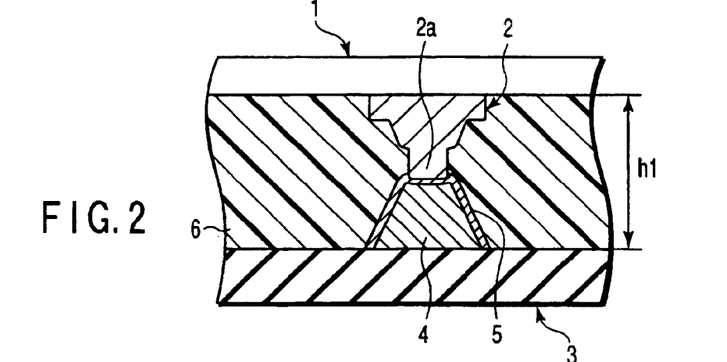
FIG. 2 is a sectional view showing a step of the method of fabricating the semiconductor device according to the first embodiment.

FIGS. 1 and 2 are sectional views showing the arrangement and fabrication steps of a semiconductor device according to the first embodiment. This embodiment is characterized in a so-called flip chip wireless bonding method.

First, the arrangement of the semiconductor device according to this embodiment will be explained below.

As shown in FIG. 1, a bump (stud-bump) 2 electrically connected to an electrode (not shown) is formed on one major surface of a semiconductor chip 1. Although a plurality of such stud-bumps 2 are actually formed on a single semiconductor chip 1, only one is shown in FIG. 1 and the rest are omitted.

In this embodiment, the stud-bump 2 is formed using a material which hardly deteriorates. More specifically, the stud-bump 2 is formed using gold (Au) which rarely oxidizes. This Au stud-bump 2 has a protruding end portion 2a. This shape can be readily formed by adhering a predetermined amount of gold to the electrode of the semiconductor chip 1 by a bonding tool (not shown), and moving this bonding tool away from the semiconductor chip 1 while the supply of the gold is stopped. By this formation method, the end portion 2a of the stud-bump 2 is pointed as if a gold wire is torn off.

A chip-mounting-substrate 3 as a chip-mounting-member (packaging-substrate) on which the semiconductor chip 1 is to be mounted is made of, e.g., a glass epoxy resin. Various lines (not shown) are formed inside or on the surface of this chip-mounting-substrate 3. The chip-mounting-substrate 3 of this embodiment is formed into a thin member which is as thin as paper. That is, a substrate so-called PTP (Paper Thin Package) substrate is used. On one major surface of this chip-mounting-substrate 3, a copper (Cu) lead (inner lead) 4 electrically connected to various lines is formed.

Unlike in the prior art described previously, this Cu inner lead 4 need not support the Sn—Ag plated-bump 105 which is a thick projection (projected-member) largely extended in the widthwise direction on the lead. Accordingly, the sectional shape of this inner lead 4 is a substantially trapezoidal shape which narrows in the direction away from the chip-mounting-substrate 3. Also, the width of the inner lead 4 on the side of the substrate is substantially equal or smaller than the maximum width of the stud-bump 2. That is, compared to the width of the Cu lead 104 explained in the prior art, the portion of the inner lead 4 on the side of the substrate is very narrow and compact. More specifically, the width of the inner lead 4 on the side of the substrate is about 40 $\mu$m, and the width of the end portion of this inner lead 4 is about 20 to 30 $\mu$m. This width of the end portion of the inner lead 4 is substantially the same as the maximum width of the end portion 2a of the stud-bump 2. By giving this inner lead 4 the aforementioned size and shape, a lead spacing (lead pitch) can be narrowed. According to the experiment conducted by the present inventors, a lead spacing (pitch) which was conventionally about 84 $\mu$m could be narrowed to at least about 60 $\mu$m which was approximately 70% or more of the conventional spacing.

The surface of the inner lead 4 is plated. More specifically, a thin film plated portion (thin plated film, plated layer) 5 about 0.6 $\mu$m thick is formed to cover substantially the entire surface of that portion of the inner lead 4, which is to be connected to the stud-bump 2 and a portion around this connecting portion. This makes the material of the connecting portion of the stud-bump 2 and inner lead 4 and the portion surrounding this connecting portion difficult to oxidize and deteriorate, without using the Sn—Ag plated-bump 105 explained in the prior art. This can also eliminate the possibility in the prior art that the Sn—Ag plated-bump 105 falls from the lead 104 to come in contact with the side surface of an adjacent lead 104 to cause an inferior electrical contact such as a short circuit. It is, of course, unnecessary to take any positional deviation of the Sn—Ag plated-bump 105 into consideration. Accordingly, an operation (to be described later) of connecting the stud-bump 2 and inner lead 4 can be performed simply and rapidly.

Also, in the conventional TAB (Tape Automated Bonding) method, the thickness of a thin plated film formed on the surface of an inner lead is at most about 0.2 $\mu$m. In contrast, the thickness of the thin plated film 5 formed on the surface of the inner lead 4 of this embodiment is relatively large, about 0.6 $\mu$m. Therefore, the resistance against heat and water of the inner lead 4 of this embodiment is relatively high. That is, the inner lead 4 inside this thin plated film 5 hardly deteriorates.

In this embodiment, the thin plated film 5 is formed by electroless plating by using tin (Sn) as a material. Compared to electroplating, this electroless plating can shorten the time required for the process and does not require any special member or apparatus such as a mask or electrode. This reduces the operation, increases the production efficiency, and decreases the production cost.

A method of fabricating the semiconductor device according to this embodiment will be described next.

First, the semiconductor chip 1 and the chip-mounting-substrate 3 are placed so that the stud-bump 2 and inner lead 4 oppose each other. In this state, an encapsulating-member 6 for encapsulating a gap between the semiconductor chip 1 and the chip-mounting-substrate 3 and adhering the semiconductor chip 1 and the chip-mounting-substrate 3 is formed (filled) between the semiconductor chip 1 and the chip-mounting-substrate 3. This encapsulating-member 6 is formed by a thermosetting resin which achieves its thermosetting properties and adhesion at temperatures at which the thin Sn plated film 5 does not melt or no eutectic mixture is produced in the connecting portion between the stud-bump 2 and inner lead 4. More specifically, the encapsulating-member 6 is formed by a thermoplastic resin which achieves its thermosetting properties and adhesion at a temperature of about 160° C. to 200° C. This encapsulating-member 6 can also be formed on the chip-mounting-substrate 3 in advance before the semiconductor chip 1 is opposed to the chip-mounting-substrate 3.

Subsequently, the semiconductor chip 1, the chip-mounting-substrate 3, and encapsulating resin 6 are heated and pressed from both sides in the direction of thickness. The temperature of this thermocompression is set in the range of about 160° C. to 200° C. According to the experiment conducted by the present inventors, the semiconductor chip 1 and the chip-mounting-substrate 3 could be adhered and encapsulated extremely rapidly when thermocompression was performed at about 180° C. In addition, the adhered and encapsulated states of the semiconductor chip 1 and the chip-mounting-substrate 3 and the condition of the thin plated film 5 were very good. Also, the time required for this thermocompression was very short, so the thermal load on the electrical system including the stud-bump 2, inner lead 4, and the like could be greatly reduced.

Generally, a temperature higher than 200° C. is necessary in TAB (Tape Automated Bonding) or in a method in which a bump and lead are connected by forming a eutectic mixture between them. If thermocompression is performed at such a high temperature, the thermal load on a semiconductor device naturally increases compared to that in this embodiment, and this leads to quality deterioration of the semiconductor device. Consequently, the yield of the semiconductor device lowers, and the production efficiency drops. In contrast, in the semiconductor device fabrication method of this embodiment, a semiconductor device can be fabricated by suppressing the load caused by heat at a relatively low temperature of about 180° C. This improves the yield and production efficiency of the semiconductor device. In addition, the quality of the semiconductor device fabricated by this semiconductor device fabrication method does not easily deteriorate.

Subsequently, as shown in FIG. 2, heating is performed under pressing until the stud-bump 2 comes in contact with the inner lead 4 and the width of the end portion 2a changes to be substantially the same as the width of the end portion of the inner lead 4. This realizes an electrically appropriate connection between the stud-bump 2 and the surface of the thin plated film 5 of the inner lead 4. After that, while the pressing force is held constant so that the end portion 2a of the stud-bump 2 does not excessively deform, heating is continued to solidify the encapsulating resin 6. After this solidification of the encapsulating resin is confirmed, the heating and pressing are released, and this thermocompression step is complete. Consequently, the stud-bump 2 and inner lead 4 are connected in an electrically appropriate state via the thin plated film 5. Additionally, the semiconductor chip 1 and the chip-mounting-substrate 3 are adhered (fixed) while the portion between them is substantially completely encapsulated with the encapsulating resin 6.

In the semiconductor device fabrication method of this embodiment as described above, it is possible to simultaneously connect the stud-bump 2 and inner lead 4, adhere the semiconductor chip 1 and the chip-mounting-substrate 3, and encapsulate the gap between them in an appropriate state. In the following explanation, this step will be referred to as a simultaneous connecting/encapsulating step (flip chip simultaneous connecting/encapsulating step).

After the semiconductor chip 1 is fixed on the chip-mounting-substrate 3 in the simultaneous connecting/encapsulating step described above, a packaging step begins. In this embodiment, as shown in, e.g., FIG. 3, encapsulating resins 7 and 8 are formed around the semiconductor chip 1 in addition to the encapsulating resin 6 so that the semiconductor chip 1 is the center of symmetry. These encapsulating resins 7 and 8 are formed by the same material as the encapsulating resin 6. On the side of the semiconductor chip 1 away from the chip-mounting-substrate 3, a protective-substrate 9 as a surface-substrate for protecting the semiconductor chip 1 against external shocks and water is formed. An adhesive (adhesive resin) or the like can also be formed between this protective-substrate 9 and the semiconductor chip 1.

Figure 3:
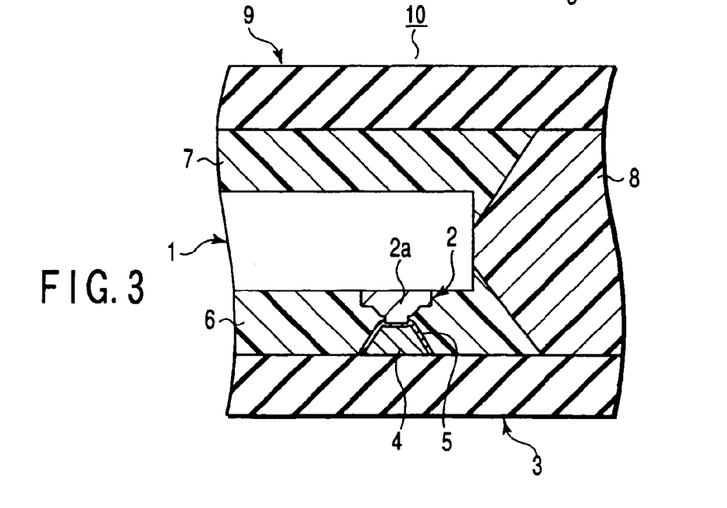
FIG. 3 is a sectional view showing a portion of the semiconductor device according to the first embodiment.

After that, as in the above-mentioned simultaneous connecting/encapsulating step, the semiconductor chip 1, the chip-mounting-substrate 3, encapsulating resins 6, 7, and 8, and protective-substrate 9 are packaged as they are pressed from both sides in the direction of thickness while heat is applied to them. A ground-substrate, ball-layer-substrate, and the like (none of them is shown) is then attached by thermocompression or the like. Consequently, a semiconductor device 10 in which the single semiconductor chip 1 is mounted on the single chip-mounting-substrate 3 is fabricated. In this semiconductor device 10, the chip-mounting-substrate 3 also functions as a so-called enclosure (packaging material).

As explained above, in the semiconductor device fabrication method according to the first embodiment which includes the flip chip simultaneous connecting/encapsulating step, a semiconductor device can be made compact by decreasing the lead pitch. In addition, it is possible to efficiently, inexpensively, and easily fabricate a high-quality, long-life semiconductor device whose electrical performance and reliability hardly deteriorate. Also, the semiconductor device fabrication method according to the first embodiment can be practiced without using any special apparatus, equipment, or material, the method is extremely versatile. Accordingly, almost no cost burden is imposed by the semiconductor device fabrication steps.

As shown in FIG. 3, this semiconductor device 10 has a structure in which the chip-mounting-substrate 3, the protective-substrate 9, and the encapsulating resins 6, 7, and 8 made of the same material are symmetrically arranged around the semiconductor chip 1 so that this semiconductor chip 1 is the center of symmetry. With this symmetrical structure, complicated deformation caused by a warp or strain of the chip-mounting-substrate 3 and the like can be well suppressed without forming any special reinforcing structure or reinforcing part inside the semiconductor device 10, or increasing the thickness of the chip-mounting-substrate 3. Accordingly, complicated deformation of the whole semiconductor device 10 can be well suppressed. Also, in this symmetrical structure, even if complicated deformation occurs inside the semiconductor device 10, this deformation occurs around the semiconductor chip 1 as the center of symmetry. Therefore, the stress caused by this deformation is dispersed substantially uniformly toward the perimeter of the semiconductor chip 1, i.e., the stress does not easily concentrate to a specific portion inside the semiconductor device 10. In particular, the deformation stress rarely concentrates to the semiconductor chip 1 as an important component of the semiconductor device 10. These function and effect of relaxing the deformation stress by dispersion is very effective in a thin compact single-layered structure single-chip package which is generally regarded as weak against stress. That is, these function and effect are very effective in the semiconductor device 10 of this first embodiment.

As described above, although the semiconductor device 10 is thin and compact, components do not easily peel off from a point to which a deformation stress concentrates, or the deformation load does not easily concentrate to the semiconductor chip. Therefore, this semiconductor device 10 hardly deteriorates in quality, has a long life, easily holds electrical performance in a stable state, and has high reliability. Also, the semiconductor device 10 having the aforementioned structure is strong against a warp or strain of the whole package resulting from changes in the temperature or humidity. Therefore, the semiconductor device 10 is rarely restricted by its use environment. As described above, the semiconductor device 10 is very practical because it is compact and highly versatile.

(Second Embodiment)

Figure 4:
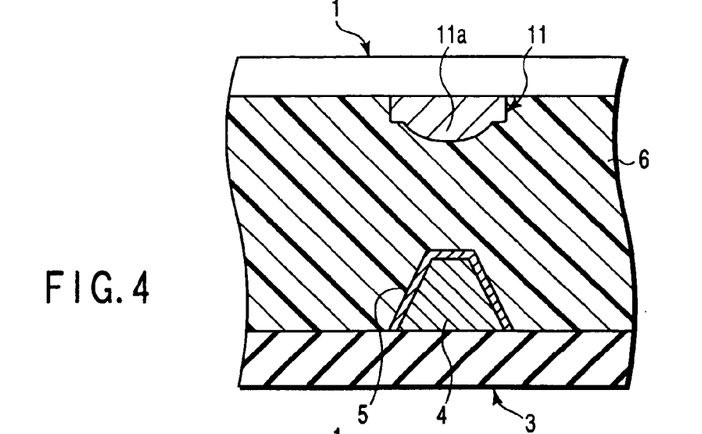
FIG. 4 is a sectional view showing a step of a method of fabricating a semiconductor device according to the second embodiment.
Figure 5:
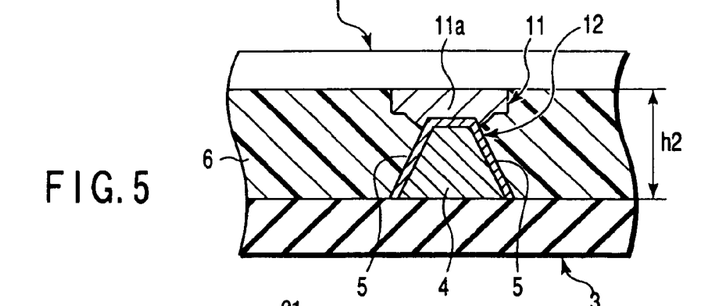
FIG. 5 is a sectional view showing a step of the method of fabricating the semiconductor device according to the second embodiment.

FIGS. 4 and 5 are sectional views showing the arrangement and fabrication steps of a semiconductor device according to the second embodiment. The same reference numerals as in the first embodiment denote the same parts, and a detailed explanation thereof will be omitted.

The semiconductor device of this embodiment differs from the first embodiment described above in the shape of an end portion 11a of an Au stud-bump 11 formed on a semiconductor chip 1, and the connected state of this stud-bump 11 and a Cu inner lead 4.

As shown in FIG. 4, the end portion 11a of the stud-bump 11 is formed into a substantially flat shape. This shape can be formed by, e.g., the two following methods. In one method, a stud-bump 2 is formed on an electrode of the semiconductor chip 1 by using a bonding tool as in the first embodiment, and an end portion 2a of this stud-bump 2 is pressed until this end portion 2a assumes a substantially flat shape. The step of pressing the end portion 2a of the stud-bump 2 is performed using a so-called leveling tool. In the other method, an end portion of a stud-bump 2 on the side of an electrode is formed on an electrode of the semiconductor chip 1, and a bonding tool is moved along the major surface of the semiconductor chip 1 while the supply of gold is stopped. In this method, the bonding tool is not moved in the direction away from the semiconductor chip 1, unlike in the first embodiment. As a consequence, the end portion 11a of the stud-bump 11 assumes a substantially flat shape.

This stud-bump 11 having the above shape and the inner lead 4 are electrically connected via a thin plated film 5 in a simultaneous connecting/encapsulating step in the same manner as in the first embodiment. In this second embodiment, as shown in FIG. 5, the semiconductor chip 1 and the chip-mounting-substrate 3 are pressed from both sides in the direction of thickness until the end portion of the inner lead 4 penetrates into (is embedded in) the stud-bump 11 by a predetermined amount from the end portion 11a. As in the first embodiment, no eutectic mixture is formed in a connecting portion 12 between the stud-bump 11 and inner lead 4, i.e., these stud-bump 11 and inner lead 4 are connected in an electrically appropriate state.

In this embodiment, the end portion 11a of the stud-bump 11 is formed into a substantially flat shape. Therefore, the stud-bump 11 and inner lead 4 readily come in contact with each other in an electrically appropriate state. As a consequence, the operation of connecting the stud-bump 11 and inner lead 4 can be performed more easily and rapidly. Also, a margin for positional deviation between the stud-bump 11 and inner lead 4 can be increased when the simultaneous connecting/encapsulating step is performed. This increases a margin for positional deviation between the semiconductor chip 1 and the chip-mounting-substrate 3. In the semiconductor device fabrication method of this embodiment, therefore, a compact, high-quality, and long-life semiconductor device can be fabricated more efficiently, inexpensively, and easily.

In this embodiment, the penetration amount (embedded amount) of the inner lead 4 which penetrates into the stud-bump 11 can be properly and readily adjusted to an appropriate amount. That is, compared to the first embodiment, the spacing between the semiconductor chip 1 and the chip-mounting-substrate 3 can be easily adjusted, so the thickness of the entire semiconductor device can be decreased. In the following explanation, the spacing between the semiconductor chip 1 and the chip-mounting-substrate 3 will be referred to as a chip connection height.

More specifically, this chip connection height in a semiconductor device of prior art and a chip connection height h1 in the semiconductor device 10 of the first embodiment shown in FIG. 2 are about 60 $\mu$m. In contrast, according to the experiment conducted by the present inventors, a chip connection height h2 in the semiconductor device of the second embodiment shown in FIG. 5 could be decreased to about 30 $\mu$m. In the recent semiconductor industry, a present target value of the chip connection height is about 40 $\mu$m. Therefore, the chip connection height in the semiconductor device of the second embodiment is much smaller than this target value. This is extremely effective in a thin semiconductor package, particularly a thin semiconductor package whose package thickness is about 0.2 mm or less.

If the thickness of the semiconductor chip 1 is about 60 $\mu$m and the thickness of the chip-mounting-substrate 3 is about 50 $\mu$m, the thickness from the outer surface of the semiconductor chip 1 to the outer surface of the chip-mounting-substrate 3 is about 170 $\mu$m. By contrast, in the second embodiment in which the chip connection height h2 can be set to about 30 $\mu$m, the thickness from the outer surface of the semiconductor chip 1 to the outer surface of the chip-mounting-substrate 3 can be decreased to about 140 $\mu$m.

As described above, in the semiconductor device and semiconductor device fabrication method according to the second embodiment, the lead pitch can be decreased as in the first embodiment. In addition, the thickness of the semiconductor device can be decreased. This makes the semiconductor device more compact.

(Third Embodiment)

Figure 6:
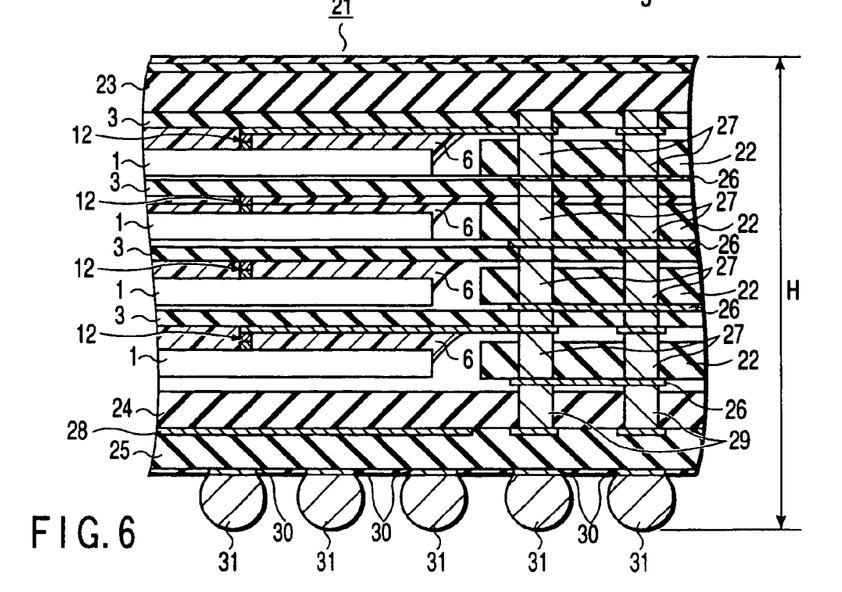
FIG. 6 is a sectional view showing a portion of a semiconductor device according to the third embodiment.

FIG. 6 is a sectional view showing the arrangement of a semiconductor device according to the third embodiment. The same reference numerals as in the first embodiment denote the same parts, and a detailed explanation thereof will be omitted.

A semiconductor device 21 of this embodiment includes a plurality of stacked layers, e.g., four stacked layers of semiconductor chips 1 and chip-mounting-substrates 3 connected and encapsulated at the same time by the semiconductor device fabrication method of the second embodiment described above. That is, the semiconductor device 21 of this embodiment is a so-called stacked package as one of multi-chip packages including a plurality of semiconductor chips 1. A multi-chip package is also called a multi-chip module or multi-block module. Likewise, a stacked package is also called a stacked module or stacked device.

In the semiconductor device 21 of this embodiment, the semiconductor chip 1 is, e.g., a 256-MB DRAM. Accordingly, the semiconductor device 21 of this embodiment is a so-called stacked DRAM package. This stacked DRAM package 21 is a kind of a semiconductor device called a stacked memory package or stacked memory module in which a plurality of layers of memory chips are stacked.

The steps of fabricating the stacked DRAM package 21 in a semiconductor device fabrication method according to this embodiment will be described below.

First, a semiconductor chip 1 is mounted on a chip-mounting-substrate 3 by simultaneous connection/encapsulation. Four layers of this pair of the semiconductor chip 1 and the chip-mounting-substrate 3 are stacked. More specifically, intermediate-substrates 22 as intermediate bases are alternately arranged in the stacking direction between chip-mounting-substrates 3 of the four layers. Subsequently, the stacked semiconductor chips 1, chip-mounting-substrates 3, and intermediate-substrates 22 are sandwiched from both sides in the stacking direction by using a surface-substrate 23, power-ground-substrate 24, and ball-layer-substrate 25. Appropriate adhesives and the like can also be formed between these substrates 3, 22, 23, 24, and 25. After that, the substrates 3, 22, 23, 24, and 25 are adhered by thermocompression in the stacking direction, thereby fabricating the stacked DRAM package 21 shown in FIG. 6.

In this stacked DRAM package 21, the surface-substrate 23 also functions as a protective-substrate for protecting the internal semiconductor chips. Also, each of the four intermediate-substrates has interconnecting lines 26 and interconnecting terminals (interconnecting via plugs) 27 formed in predetermined positions with predetermined shapes. Similarly, the power-ground-substrate 24 has power ground lines 28 and power ground terminals (power ground via plugs) 29 formed in predetermined positions with predetermined shapes. The ball-layer-substrate 25 has external terminal connecting lines 30 and external terminals 31 formed in predetermined positions with predetermined shapes. The four semiconductor chips 1 are electrically connected to, e.g., an external power supply or external apparatus (not shown) through respective predetermined electrical paths via lines of the four chip-mounting-substrates 3, the inter-connecting lines 26 and interconnecting terminals 27, the power ground lines 28 and power ground terminals 29, and the external terminal connecting lines 30 and external terminals 31.

The experiment conducted by the present inventors will be explained below to compare the thickness of the stacked DRAM package 21 of this third embodiment with the thickness of a stacked DRAM package (not shown) according to prior art. More specifically, as a stacked DRAM package according to prior art, a four-layered semiconductor device (not shown) having the same arrangement as the stacked DRAM package 21 was fabricated by combining semiconductor chips 101 and the chip-mounting-substrates 103 integrated by prior art. The thickness of this stacked DRAM package according to the prior art was about 1.8 mm. By contrast, the chip connection height in each layer of the stacked DRAM package 21 of this embodiment could be decreased by about 20 $\mu$m. This chip connection height in each layer could be further decreased by about 15 $\mu$m by decreasing the thickness of, e.g., the inner lead. As a consequence, the total chip connection height of the four layers was reduced by about 140 $\mu$m, thereby decreasing the thickness of this stacked DRAM package.

In addition, by decreasing the thicknesses of the surface-substrate 23, the power-ground-substrate 24, and the ball-layer-substrate 25, the thickness of the whole stacked DRAM package 21 could be decreased by a total of about 400 $\mu$m. Accordingly, a thickness H of the stacked DRAM package of this embodiment shown in FIG. 6 could be decreased to about 1.4 mm.

As described above, the semiconductor device of this embodiment is compact regardless of its stacked structure. That is, in the semiconductor device fabrication method of this embodiment, even a multilayered structure semiconductor device can be made compact with ease. Also, this thickness decreasing effect becomes more effective as the number of stacked layers increases.

The semiconductor device and semiconductor device fabrication method according to the present invention are not limited to the first to third embodiments described above. That is, these embodiments can be practiced without departing from the gist of the present invention by partially changing their arrangements or steps to various settings or by combining these various settings.

For example, the sectional shape of the Cu inner lead is not restricted to the trapezoidal shape described earlier, provided that the size of this Cu inner lead is equivalent to that of the Au stud-bump and thereby the lead pitch can be decreased. That is, this sectional shape can also be a rectangular, square, or semicircular shape. This similarly applies to the sectional shape of the Au stud-bump. As an example, the end portion 11a of the stud-bump 11 of the second embodiment can also be recessed toward the chip 1. This allows easy penetration (embedment) of the upper end portion of the inner lead 4 into the stud-bump 11.

Also, the materials of the inner lead and stud-bump are not restricted to copper and gold, respectively. Any material can be used as long as the electrical performance of the semiconductor device can be maintained at a desired level. Likewise, the material forming the chip-mounting-substrate is not limited to the glass epoxy resin. The thin Sn plated film 5 can also be formed by electroplating, not by electroless plating described previously.

This thin Sn plated film 5 need only be formed on at least that portion of the inner lead, which is electrically connected to the stud-bump. For example, when the inner lead 4 has a trapezoidal sectional shape as in the first embodiment, a thin plated film need only be formed on at least the upper end portion (upper bottom) of this inner lead 4. This suppresses oxidation and the like in the connecting portion between the stud-bump and inner lead, thereby suppressing the possibility of deterioration of the electrical performance of the semiconductor device. An example of a method of forming a fine thin plated film like this will be briefly described below.

First, as in the first embodiment, a thin plated film is formed by electroless plating so as to cover the entire surface of that portion of an inner lead, which is to be connected to a stud-bump and a portion surrounding this connecting portion. Next, an etching preventing mask is formed only on the thin plated film formed on the upper end portion of the inner lead. In this state, etching is performed for the left and right side portions of the inner lead to remove the thin plated film formed on these side portions. In this manner, a fine thin plated film can be formed on the upper end portion of an inner lead narrower than the inner lead 104 of the prior art, while the occurrence of positional deviation during the formation is eliminated almost completely.

In this method, the left and right side portions of the inner lead can also be etched away when the thin plated film is removed, without deteriorating the electrical connection in the connecting portion between the stud-bump and inner lead, thereby forming a rectangular or square inner lead narrower than the above inner lead. This further decreases the lead pitch.

In the second embodiment, the size and shape of the inner lead relative to the stud-bump can also be set such that substantially the whole of the inner lead penetrates (is embedded in) into the stud-bump. This increases the size of the connecting region between the stud-bump and inner lead. Therefore, the semiconductor device can be made more compact while a good electrical connecting state is held in this connecting region.

Also, encapsulating resins made of a plurality of different materials can be combined and arranged asymmetrically with respect to the semiconductor chip. That is, various loads such as heat and stress applied to the semiconductor device are analyzed beforehand by experiments or computer simulation, and materials and arrangements with which these loads do not easily concentrate to the semiconductor chip are adopted.

A semiconductor chip to be mounted on a chip-mounting-substrate is not restricted to the 256-MB DRAM described in the third embodiment. That is, a logic chip and memory chip can also be mixed in a single semiconductor device. Proper semiconductor chips can be appropriately adopted in accordance with the performance and functions of a desired semiconductor device.

Furthermore, the number of semiconductor chips to be mounted on a chip-mounting-substrate, the numbers of chip-mounting-substrates and intermediate-substrates to be stacked, the internal arrangement of the whole semiconductor device, and the like can be appropriately designed in accordance with the performance and functions of a desired semiconductor device. The semiconductor device fabrication method according to the present invention can fabricate semiconductor devices superior in quality and compactness to those having the same structure but fabricated by other fabrication methods.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A semiconductor device wherein chips are stacked to have a fine pitch structure, comprising:

at least two stacked chip-mounting members, the chip-mounting members having a main surface provided with at least one lead having a width, the at least one lead having a predetermined surface including a plated portion covered with a thin film;

a plurality of semiconductor chips including a main surface on which at least one bump is formed, the bump having a width substantially greater than or equal to the width of the lead and being electrically connected to the lead via the plated portion, at least one of the semiconductor chips being mounted on each of the chip-mounting members;

at least one intermediate base arranged between the chip-mounting members, the base being provided with at least one interconnecting line and at least one interconnecting terminal, the at least one interconnecting line and at least one interconnecting terminal being electrically connected to the semiconductor chips; and an encapsulating member provided between the semiconductor chips and the chip-mounting-members.

2. A device according to claim 1, wherein said plated portion covers substantially an entire surface of a connecting portion between said lead and said bump, and of a portion around said connecting portion.

3. A device according to claim 1, wherein said plated portion is formed by electroless plating by using tin.

4. A device according to claim 1, wherein an end portion of said bump protrudes toward said lead.

5. A device according to claim 1, wherein an end portion of said bump has a substantially flat shape, and said lead penetrates into said bump in a connecting portion between said lead and said bump.

6. A device according to claim 1, wherein the plurality of semiconductor chips include semiconductor chips of different types.

7. The device according to claim 1, wherein the width of said lead is a width of a substrate-side thereof, and the width of said bump is a width of a chip-side thereof.

8. The device according to claim 1, wherein a sectional shape of said lead is formed such that a width of an end portion thereof is smaller than a width of a substrate-side thereof.

9. The device according to claim 6, wherein the plurality of semiconductor chips include at least a logic chip and a memory chip.

* * * * *

UNITED STATES PATENT AND TRADEMARK OFFICE
CERTIFICATE OF CORRECTION

PATENT NO. : 6,897,552 B2  Page 1 of 1
DATED : May 24, 2005
INVENTOR(S) : Nakao

It is certified that error appears in the above-identified patent and that said Letters Patent is hereby corrected as shown below:

Column 12,
Line 4, change "chip-mounting-members." to -- chip-mounting members. --.

Signed and Sealed this

Ninth Day of August, 2005

JON W. DUDAS
*Director of the United States Patent and Trademark Office*